United States Patent
Zhao et al.

(10) Patent No.: US 11,444,379 B2
(45) Date of Patent: Sep. 13, 2022

(54) WAVEGUIDE ANTENNA MAGNETOELECTRIC MATCHING TRANSITION

(71) Applicant: Sony Corporation, Tokyo (JP)

(72) Inventors: Kun Zhao, Stockholm (SE); Zhinong Ying, Lund (SE)

(73) Assignee: Sony Group Corporation, Tokyo (JP)

( * ) Notice: Subject to any disclaimer, the term of this patent is extended or adjusted under 35 U.S.C. 154(b) by 295 days.

(21) Appl. No.: 16/637,740

(22) PCT Filed: Aug. 9, 2017

(86) PCT No.: PCT/EP2017/070204
§ 371 (c)(1),
(2) Date: Feb. 8, 2020

(87) PCT Pub. No.: WO2019/029803
PCT Pub. Date: Feb. 14, 2019

(65) Prior Publication Data
US 2020/0212574 A1    Jul. 2, 2020

(51) Int. Cl.
*H01Q 1/24*    (2006.01)
*H01Q 5/55*    (2015.01)
(Continued)

(52) U.S. Cl.
CPC .............. *H01Q 5/55* (2015.01); *H01P 3/121* (2013.01); *H01Q 1/243* (2013.01); *H05K 1/116* (2013.01)

(58) Field of Classification Search
CPC .......... H01Q 5/55; H01Q 1/243; H01Q 13/02; H01P 3/121; H05K 1/116
See application file for complete search history.

(56) References Cited

U.S. PATENT DOCUMENTS

| 2014/0043189 A1* | 2/2014 | Lee ........................ H01Q 21/08 342/368 |
| 2014/0240187 A1* | 8/2014 | Herbsommer ......... H01Q 13/00 343/785 |

(Continued)

FOREIGN PATENT DOCUMENTS

| CN | 204809363 U | 11/2015 |
| CN | 106659447 A1 | 5/2017 |

(Continued)

OTHER PUBLICATIONS

International Search Report and Written Opinion from corresponding PCT/EP2017/070204, dated Apr. 25, 2018, 10 pages.

(Continued)

*Primary Examiner* — Hai V Tran
*Assistant Examiner* — Michael M Bouizza
(74) *Attorney, Agent, or Firm* — Tucker Ellis LLP

(57) ABSTRACT

An antenna (100) comprises a waveguide (120) formed by a first horizontal conductive layer (121) of a multi-layer circuit board (110), a second horizontal conductive layer (122) of the multi-layer circuit board, and vertical sidewalls formed by conductive vias (123, 124) extending between the first conductive layer (121) and the second conductive layer (122). Further, the antenna (100) of comprises a parallel plate resonator (150) at one end of the waveguide (120). The parallel plate resonator (150) is formed in the multilayer circuit board (110), by a first horizontal conductive plate (151) adjacent to the first conductive layer (121) and a second horizontal conductive plate (152) adjacent to the second conductive layer (122). Further, the antenna (100) comprises at least one conductive via (155) extending from one of the first conductive plate (151) and the second conductive plate (152) towards the other of the first conductive plate (151) and the second conductive plate (151).

12 Claims, 7 Drawing Sheets

(51) Int. Cl.
    *H01P 3/12*           (2006.01)
    *H05K 1/11*           (2006.01)

(56) References Cited

U.S. PATENT DOCUMENTS

| | | |
|---|---|---|
| 2015/0380801 A1 | 12/2015 | Cammarata |
| 2017/0047658 A1 | 2/2017 | Zhinong et al. |
| 2018/0108969 A1* | 4/2018 | Pucci .................. H01Q 13/02 |

FOREIGN PATENT DOCUMENTS

| | | |
|---|---|---|
| JP | H08148911 A | 6/1996 |
| JP | 2007104156 A | 4/2007 |
| WO | 2016111107 A1 | 7/2016 |
| WO | 2016178609 A1 | 11/2016 |

OTHER PUBLICATIONS

Esquius-Morote, Marc et al., "A Printed Transition for Matching Improvement of SIW Horn Antennas", IEEE Transaction on Antennas and Propagation, vol. 61, No. 4, Apr. 1, 2013, pp. 1923-1930.

\* cited by examiner

WAVEGUIDE ANTENNA MAGNETOELECTRIC MATCHING TRANSITION

FIELD OF THE INVENTION

The present invention relates to an antenna and to a communication device equipped with such antenna.

BACKGROUND OF THE INVENTION

In wireless communication technologies, various frequency bands are utilized for conveying communication signals. In order to meet increasing bandwidth demands, also frequency bands in the millimeter wavelength range, corresponding to frequencies in the range of about 10 GHz to about 100 GHz, are considered. For example, frequency bands in the millimeter wavelength range are considered as candidates for 5G (5th Generation) cellular radio technologies. However, an issue which arises with the utilization of such high frequencies is that antenna sizes need to be sufficiently small to match the wavelength. Further, in order to achieve sufficient performance, various polarizations of radio signals may need to be supported and/or multiple antennas (e.g., in the form of an antenna array) may be needed in small sized communication devices, such as mobile phones, smartphones, or similar communication devices.

One type of antenna which may be implemented with a compact size and allows of transmitting radio signals with vertical polarization is an SIW (Surface Integrated Waveguide) antenna. In the case of an SIW antenna, conductive structures printed on a circuit board are used to form a compact size waveguide which can be efficiently integrated with other circuitry. SIW antennas are for example described in "A Printed Transition for Matching Improvement of SIW Horn Antennas" by M. Esquius-Morote et al., IEEE TRANSACTIONS ON ANTENNAS AND PROPAGATION, VOL. 61, NO. 4, APRIL 2013. However for applications requiring utilization of high frequencies, such as for a 5G cellular radio technologies, these SIW antennas may lack sufficient bandwidth.

Accordingly, there is a need for compact size antennas which offer good bandwidth.

SUMMARY OF THE INVENTION

According to an embodiment, an antenna is provided. The antenna comprises a waveguide formed by a first horizontal conductive layer of a multi-layer circuit board, a second horizontal conductive layer of the multi-layer circuit board, and vertical sidewalls formed by conductive vias extending between the first conductive layer and the second conductive layer. Further, the antenna comprises a parallel plate resonator at one end of the waveguide. The parallel plate resonator is formed in the multi-layer circuit board. Specifically, the parallel plate resonator is formed by a first horizontal conductive plate adjacent to the first conductive layer and a second horizontal conductive plate adjacent to the second conductive layer. Further, the antenna comprises at least one conductive via extending from one of the first conductive plate and the second conductive plate towards the other of the first conductive plate and the second conductive plate. The parallel plate resonator may be used to match a resonant frequency of the antenna to a desired operating frequency range of the antenna. Providing the conductive via(s) extending from the first conductive plate and/or the second conductive plate allows for achieving an enhanced bandwidth of the antenna, e.g., a bandwidth of at least 8 GHz, typically of 10 GHz or more.

According to an embodiment, the antenna comprises multiple conductive vias extending from one of the first conductive plate and the second conductive plate towards the other of the first conductive plate and the second conductive plate. Specifically, the antenna may comprise at least one first conductive via extending from the first conductive plate towards the second conductive plate, and at least one second conductive via extending from the second conductive plate towards the first conductive plate. By using the multiple conductive extending from the first conductive plate and/or the second conductive plate of the parallel plate resonator, a radiation pattern of the antenna can be tuned to a desired geometry. For example, by using an arrangement of the conductive vias extending from the first conductive plate and/or the second conductive plate which is symmetric with respect to a central axis of the waveguide, a substantially symmetric radiation pattern of the antenna can be achieved.

According to an embodiment, a vertical height of the at least one conductive via extending from the first conductive plate and/or the second conductive plate of the parallel plate resonator is less than a vertical distance between the first conductive plate and the second conductive plate. Accordingly, the at least one conductive via does not form a conductive path between the first conductive plate and the second conductive plate. In this way, the bandwidth of the antenna can be efficiently enhanced while at the same time maintaining a desired resonant behavior of the parallel plate resonator.

According to an embodiment, the antenna comprises a further parallel plate resonator. The further parallel plate resonator is formed in the multi-layer circuit board by a first further horizontal conductive plate adjacent to the first conductive plate of the parallel plate resonator and a second further horizontal conductive plate adjacent to the second conductive plate of the parallel plate resonator. Accordingly, a cascade of parallel plate resonators may be formed at one end of the waveguide. By cascading multiple parallel plate resonators, the bandwidth of the antenna can be further enhanced.

According to an embodiment, the antenna also comprises at least one conductive via extending from one of the first further conductive plate and the second further conductive plate of the further parallel plate resonator towards the other of the first further conductive plate and the second further conductive plate of the further parallel plate resonator. Providing the conductive via(s) extending from the first further conductive plate and/or the second further conductive plate allows for achieving a still further enhanced bandwidth of the antenna and/or for tuning the bandwidth into a desired range.

According to an embodiment, the antenna comprises multiple conductive vias extending from one of the first further conductive plate and the second further conductive plate of the further parallel plate resonator towards the other of the first further conductive plate and the second further conductive plate of the further parallel plate resonator. Specifically, the antenna may comprise at least one first conductive via extending from the first further conductive plate towards the second further conductive plate, and at least one second conductive via extending from the second further conductive plate towards the first further conductive plate. By using the multiple conductive vias extending from the first further conductive plate and/or the second further conductive plate of the further parallel plate resonator, the radiation pattern of the antenna can be tuned to a desired geometry. For example, by using an arrangement of the conductive vias extending from the first further conductive plate and/or the second further conductive plate which is symmetric with respect to a central axis of the waveguide, a substantially symmetric radiation pattern of the antenna can be achieved.

According to an embodiment, a vertical height of the at least one conductive via extending from the first further conductive plate and/or the second further conductive plate of the further parallel plate resonator is less than a vertical distance between the first further conductive plate and the second further conductive plate. Accordingly, the at least one conductive via does not form a conductive path between the first conductive plate and the second conductive plate. In this way, the bandwidth of the antenna can be efficiently enhanced while at the same time maintaining a desired resonant behavior of the further parallel plate resonator.

According to an embodiment, the antenna is configured for transmission of radio signals having a wavelength of more than 1 mm and less than 3 cm, corresponding to frequencies of the radio signals in the range of 10 GHz to 300 GHz.

According to a further embodiment, a communication device is provided, e.g., in the form of a mobile phone, smartphone or similar user device. The communication device comprises at least one antenna according to any one of the above embodiments. Further, the communication device comprises at least one processor configured to process communication signals transmitted via the at least one antenna. The communication device may also comprise radio front and circuitry arranged on the multi-layer circuit board of the antenna.

The above and further embodiments of the invention will now be described in more detail with reference to the accompanying drawings.

DETAILED DESCRIPTION OF EMBODIMENTS

Figure 1A:
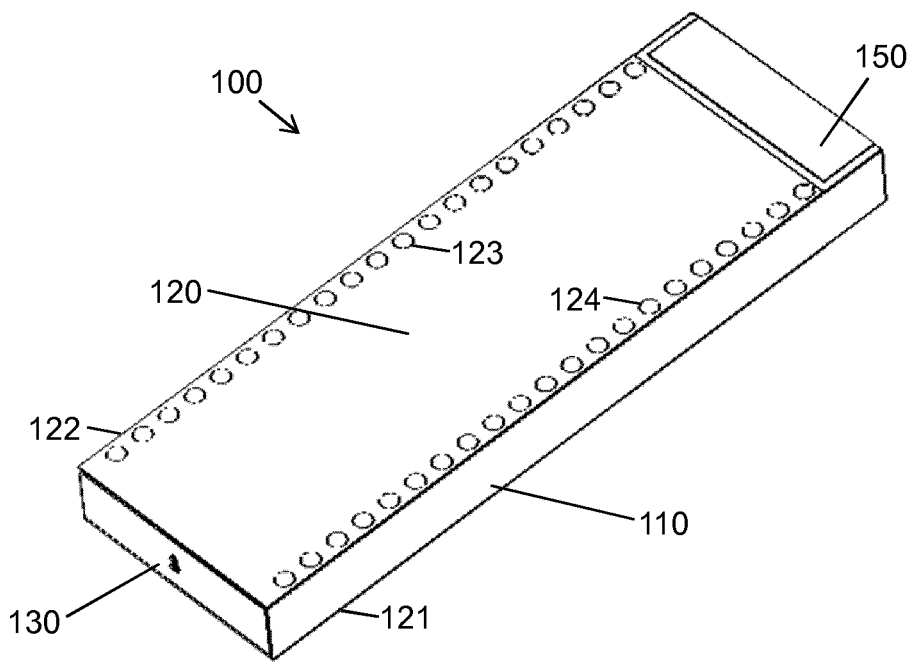
FIG. 1A shows a perspective view schematically illustrating an antenna according to an embodiment of the invention.

In the following, exemplary embodiments of the invention will be described in more detail. It has to be understood that the following description is given only for the purpose of illustrating the principles of the invention and is not to be taken in a limiting sense. Rather, the scope of the invention is defined only by the appended claims and is not intended to be limited by the exemplary embodiments described hereinafter.

The illustrated embodiments relate to antennas for transmission of radio signals, in particular of short wavelength radio signals in the cm/mm wavelength range. The illustrated antennas and antenna devices may for example be utilized in communication devices, such as a mobile phone, smartphone, tablet computer, or the like.

In the illustrated concepts, a multi-layer circuit board is utilized for forming a patch antenna. The multi-layer circuit board has multiple layers stacked in a vertical direction. The layers of the multi-layer circuit board may be individually structured with patterns of conductive strips. In particular, conductive strips formed on different layers of the multi-layer circuit board may be connected to each other by conductive vias extending between the conductive strips of different layers to form a waveguide and at least one parallel plate resonator at an exit end of the waveguide.

Further, one or more layers of the multi-layer circuit board may be utilized in an efficient manner for connecting the patch antenna to radio front end circuitry. Specifically, a small size of the patch antenna and short lengths of connections to the patch antenna may be achieved. In the embodiments as further detailed below, it will be assumed that the multi-layer circuit board is a printed circuit board (PCB), based on structured metal layers printed on resin and fiber based substrate layers. However, it is noted that other multi-layer circuit packaging technologies could be used as well for forming the multi-layer circuit board, such as LTCC (Low Temperature Co-Fired Ceramic).

FIG. 1 shows a perspective view illustrating an antenna 100 which is based on the illustrated concepts. In the illustrated example, the antenna 100 includes a multi-layer PCB 110 and a waveguide 120 formed in the multi-layer PCB 110. The multi-layer PCB 110 includes multiple PCB layers which are stacked in a vertical direction. The PCB layers may for example each correspond to a structured metallization layer on an isolating substrate. The waveguide 120 is formed of a first conductive layer 121 in one of the PCB layers and a second conductive layer 122 in another one of the PCB layers. Sidewalls of the waveguide 120 are formed by conductive vias 123, 124 extending between the first conductive layer 121 and the second conductive layer 122. In particular, a first sidewall of the waveguide 120 is formed by the conductive vias 123, and an opposite second sidewall of the waveguide is formed by the conductive vias 124. Although FIG. 1 shows the first conductive layer 121 as being a bottommost layer of the PCB 110 and the second conductive layer 122 as being a topmost layer of the PCB 110, it is to be understood that at least one of the first conductive layer 121 and the second conductive layer 122 could be formed in some intermediate PCB layer. Similarly, it is noted that the conductive vias 123, 124 do not need to be formed adjacent to an out of the PCB 110, but could also be formed in a more central region of the PCB 110.

As further illustrated, the antenna 100 includes a feeding point 130 arranged at one end of the waveguide 120. The feeding point 130 allows for generating radio waves which propagate in the waveguide 120. The feeding point 130 may be formed of one or more conductive strips and/or one or more conductive vias on one or more of the PCB layers.

Still further, the antenna 100 includes a parallel plate resonator 150 formed at an exit side of the waveguide 120, i.e., had a side of the waveguide 120 which is opposite to the feeding point 130. A structure of the parallel plate resonator 150 is further illustrated by a sectional view shown in FIG. 1B.

Figure 1B:
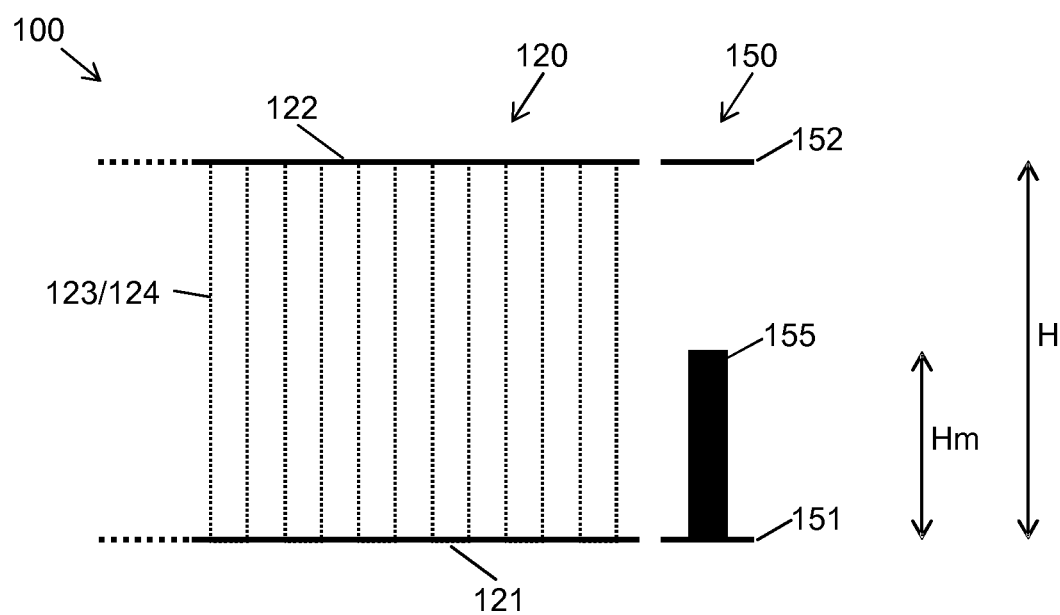
FIG. 1B shows a schematic sectional view of the antenna.

As shown in FIG. 1B, the parallel plate resonator 150 is formed of a first conductive plate 151 adjacent to the first conductive layer 121 of the waveguide 120, and a second conductive plate 152 adjacent to the second conductive layer 122 of the waveguide 120. In the illustrated example, the first conductive plate 151 of the parallel plate resonator 150 is formed on the same PCB layer as the first conductive layer 121 of the waveguide 120, and the second conductive plate 152 of the parallel plate resonator 150 is formed on the same PCB layer as the second conductive layer 122 of the waveguide 120. The first conductive plate 151 and the second conductive plate 152 of the parallel plate resonator 150 are capacitvely and inductively coupled to each other and to the waveguide 120.

As further illustrated, a conductive via 155 extends from the first conductive plate 151 of the parallel plate resonator 150 towards the second conductive plate 152 of the parallel plate resonator 150. In the illustrated example, the conductive via 155 does not extend the full distance to the second conductive plate 152. In FIG. 1B, a distance between the first conductive plate 151 and the second conductive plate 152 is denoted by H. The distance H may substantially correspond to a thickness of the PCB 110 and may be in the range of 2 to 4 mm. A vertical length of the conductive via 155 is denoted by Hm and is smaller than the distance H, e.g., 1 to 3 mm. Accordingly, the conductive via 155 does not form a conductive path between first conductive plate 151 of the parallel plate resonator 150 and the second conductive plate 152 of the parallel plate resonator 150. However, the conductive via 155 modifies inductive and capacitive coupling of the first conductive plate 151 and the second conductive plate 152. This will be further explained with reference to FIGS. 2A and 2B.

Figure 2A:
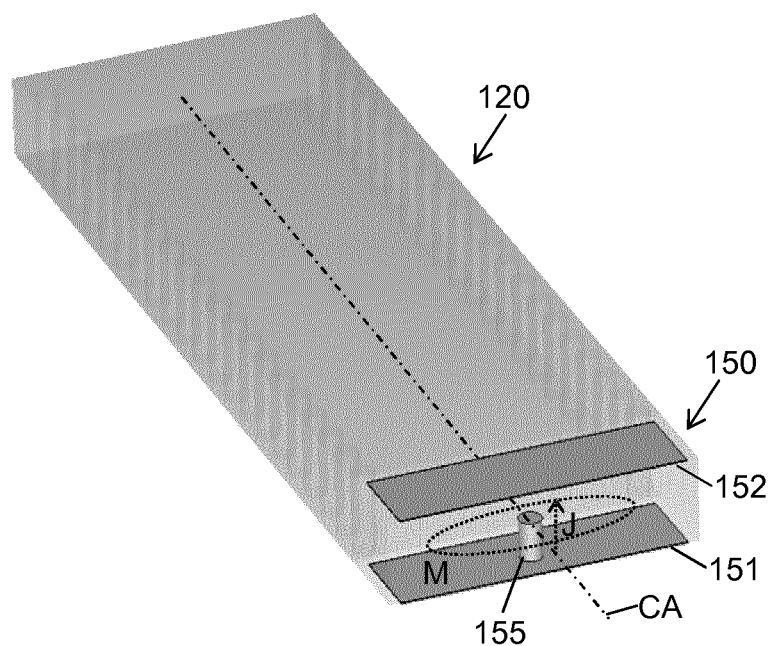
FIG. 2A shows a perspective view for illustrating effects of a monopole structure in a parallel plate resonator of the antenna.

FIG. 2A shows a perspective view of the parallel plate resonator 150 with the conductive via 155 extending from the first conductive plate 151 towards the second conductive plate 152. A dash-dot line illustrates a central axis of the waveguide 120. During operation of the antenna 100, radio waves propagate along the central axis CA of the waveguide 120 towards the exit side of the waveguide 120, where the radio waves couple to the parallel plate resonator 150. As illustrated by a dotted circular line, during operation of the antenna 100 a magnetic current M is generated in the parallel plate resonator 150. As further illustrated by a dotted arrow, an electric current J can be exited in the conductive via 155, e.g., by an electrical field in the waveguide 120. During operation of the antenna 100 the conductive via 155 may thus act similar to a passively fed monopole antenna. Accordingly, the conductive via 155 and similar structures will in the following also be referred to as "monopole structure". The contribution of the electric current J counteracts the contribution of the magnetic current M, which results in a broadened resonant frequency range of the parallel plate resonator 150. Since the parallel plate resonator 150 with the monopole structure formed by the conductive via 155 combines magnetic and electric effects to achieve matching of the antenna 100 to a desired operating frequency range, the parallel plate resonator with the monopole structure may also be referred to as a magnetoelectric matching transition.

Figure 2B:
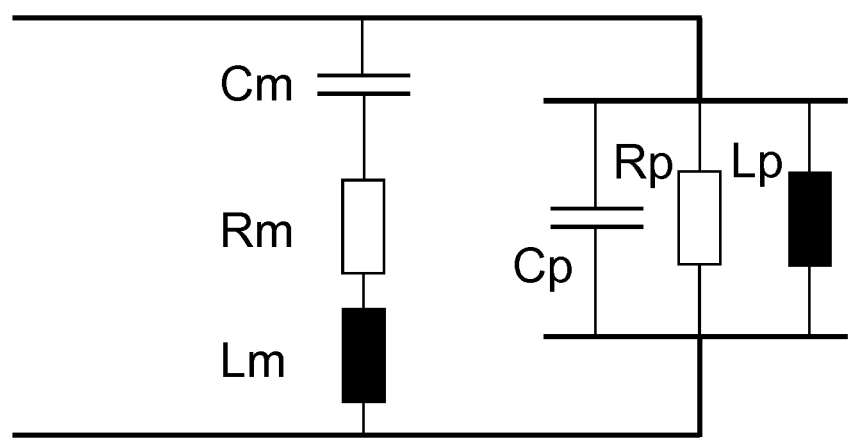
FIG. 2B schematically illustrates an equivalent circuit of the parallel plate resonator with the monopole structure.

FIG. 2B illustrates an equivalent circuit of the parallel plate resonator 150. As illustrated, the resonant behavior of the parallel plate resonator 150 may be modelled by a capacitance Cp, a resistance Rp, and an inductance Lp describing the coupling between the first conductive plate 151 and the second conductive plate 152, and a capacitance Cm, a resistance Rm and an inductance Lm describing the coupling of the first conductive plate 151 and the second conductive plate 152 through the monopole structure. As can be seen, the overall characteristics of the parallel plate resonator 150 are determined by a parallel RLC circuit with the capacitance Cp, resistance Rp, and inductance Lp and a series RLC circuit with the capacitance Cm, resistance Rm, and inductance Lm.

Figure 3:
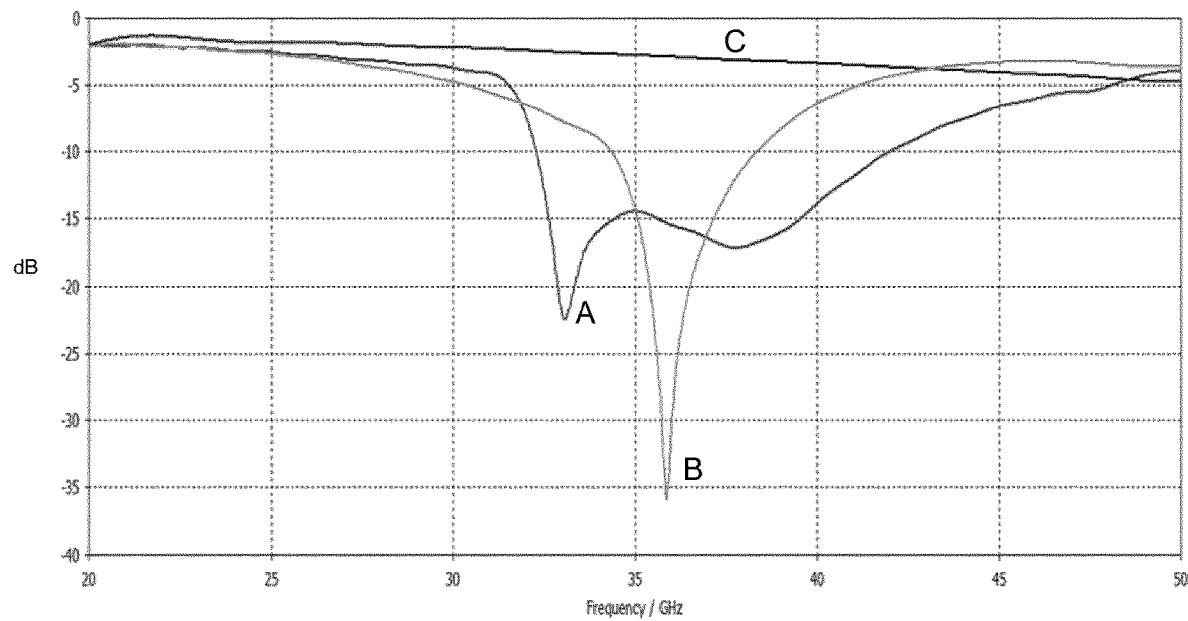
FIG. 3 shows a diagram for illustrating a frequency characteristic of the antenna.

FIG. 3 shows exemplary frequency characteristics for illustrating the effect of the magnetoelectric matching transition including the monopole structure formed by the conductive via 155. In FIG. 3, a frequency characteristic of the antenna 100 including the parallel plate resonator 150 with the monopole structure is denoted by A. A frequency characteristic of a comparative antenna which is similar to the antenna 100 but does not include the monopole structure is denoted by B. A frequency characteristic of a further comparative antenna which does not include the parallel plate resonator is denoted by C. As can be seen, a resonant frequency range of the antenna 100 including the monopole structure is significantly wider than in the case of the comparative antenna without the monopole structure. When measuring the bandwidth at −10 dB, the antenna 100 provides a bandwidth of about 10 GHz, while for the comparative antenna the band with is about 4 GHz. In the case of the comparative antenna without any parallel plate resonator, there is no resonant behavior in the observed frequency range.

Figure 4:
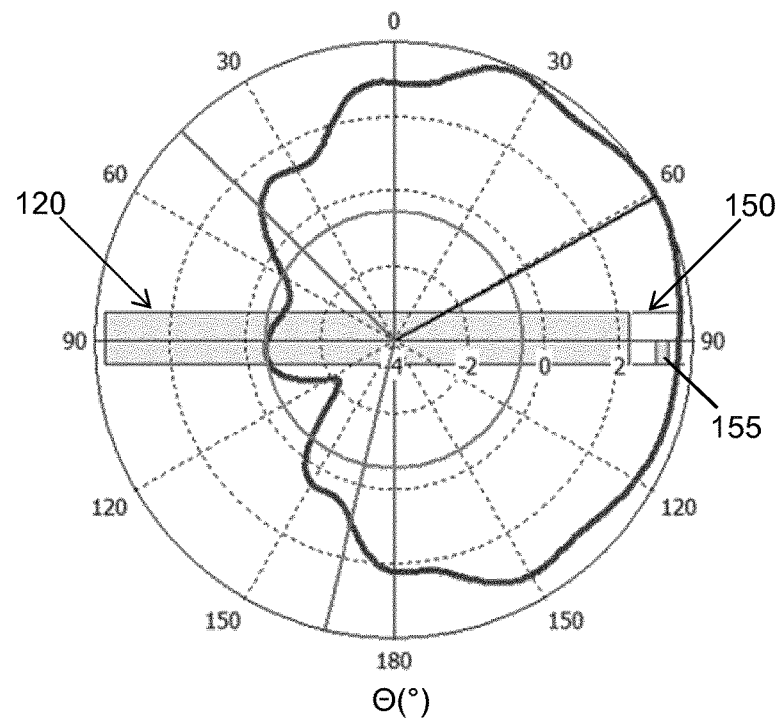
FIG. 4 shows a diagram for illustrating a radiation pattern of the antenna.
Figure 5:
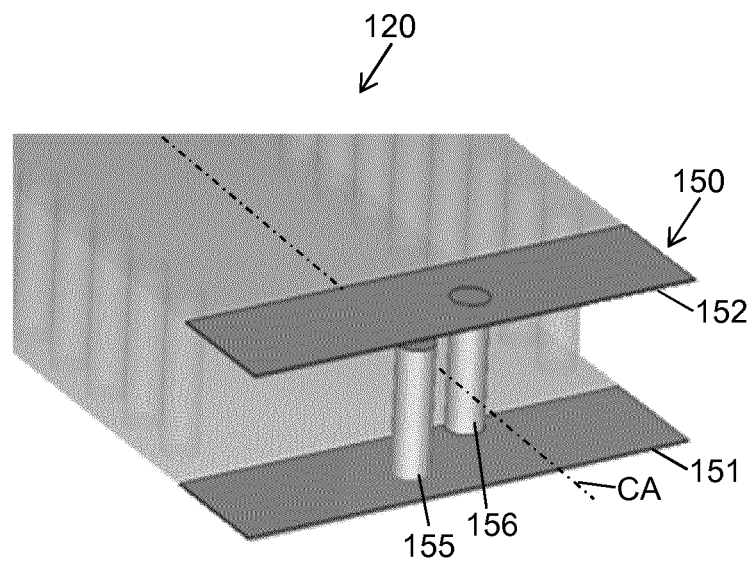
FIG. 5 shows a perspective view schematically illustrating a variant of the antenna, in which the parallel plate resonator includes multiple monopole structures.

FIG. 4 illustrates a radiation pattern of the antenna 100 as a function of an azimuthal angle θ measured from the vertical direction. In the diagram of FIG. 4 the vertical direction corresponds to θ=0°. As can be seen, the antenna 100 has a radiation pattern which is not symmetric with respect to a horizontal plane of the antenna 100. This can be attributed to the monopole structure being formed in an as symmetric manner on only the first conductive plate 151 of the parallel plate resonator 150. In order to avoid such asymmetry of the radiation pattern, the parallel plate resonator 150 may be modified to include multiple monopole structures which are arranged in a symmetric manner. FIG. 5 shows an example of a corresponding variant of the antenna 100.

Figure 6:
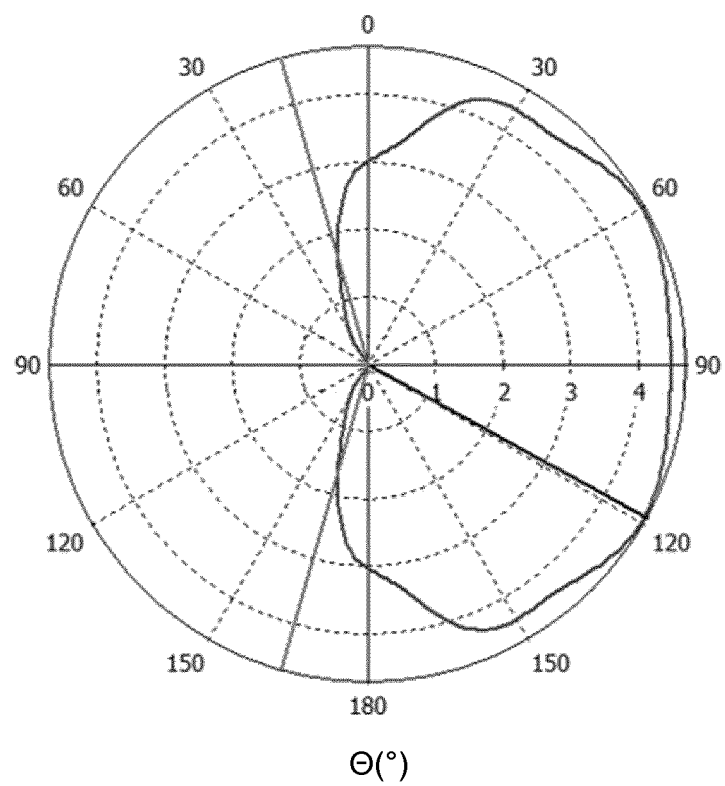
FIG. 6 shows a diagram for illustrating a radiation pattern of the antenna variant of FIG. 5.

In the example of FIG. 5, the parallel plate resonator 150 includes a first conductive via 155, which extends from the first conductive plate 151 of the parallel plate resonator 150 towards the second conductive plate 152 of the parallel plate resonator 150, and a second conductive via 156, which extends from the second conductive plate 152 of the parallel plate resonator 150 towards the first conductive plate 151 of the parallel plate resonator 150. As illustrated, the first conductive via 155 and the second conductive via 156 are formed according to an arrangement which is rotationally symmetric with respect to the central axis CA of the waveguide 120. Specifically, when rotating the first conductive via 155 and the second conductive via 156 by 180° about the central axis CA of the waveguide 120, the first conductive via 155 will take the former position of the second conductive via 156, and the second conductive via 156 will take the former position of the first conductive via 155. FIG. 6 illustrates a radiation pattern of the antenna 100 when using the modified parallel plate resonator 150 as illustrated in FIG. 5. As can be seen, the symmetric arrangement of the first conductive via 155 and the second conductive via 156 allows for avoiding an asymmetry of the radiation pattern of the antenna 100.

Figure 7:
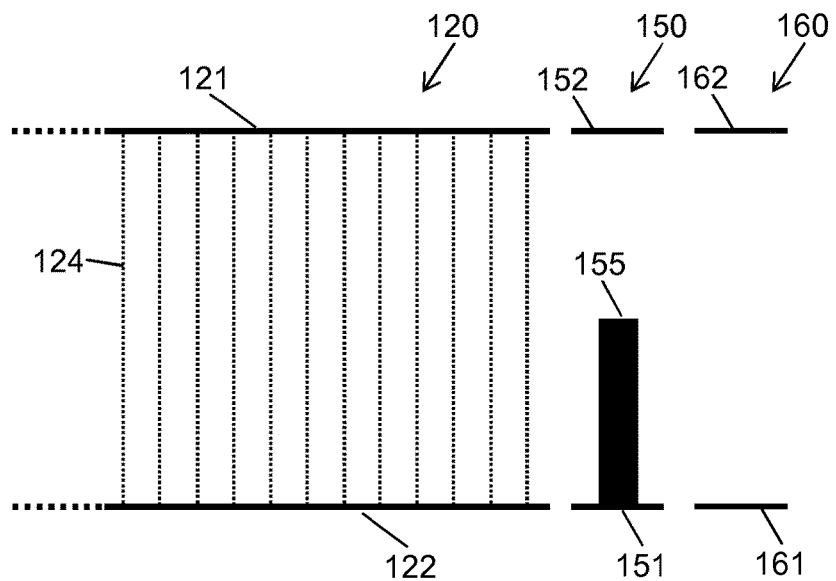
FIG. 7 shows a schematic sectional view illustrating a variant of the antenna with cascaded parallel plate resonators.

According to a further variant as illustrated by a schematic sectional view of FIG. 7, the magnetoelectric matching transition of the antenna 100 may further include an additional parallel plate resonator 160. As illustrated in FIG. 7, the additional parallel plate resonator 160 is formed of a first conductive plate 161 adjacent to the first conductive plate 151 of the parallel plate resonator 150, and a second conductive plate 162 adjacent to the second conductive plate 152 of the of the parallel plate resonator 150. In the illustrated example, the first conductive plate 161 of the additional parallel plate resonator 160 is formed on the same PCB layer as the first conductive plate 151 of the parallel plate resonator 150 and the first conductive layer 121 of the waveguide 120. Similarly, the second conductive plate 162 of the additional parallel plate resonator 160 is formed on the same PCB layer as the second conductive plate 152 of the parallel plate resonator 150 and the second conductive layer 122 of the waveguide 120. The first conductive plate 161 and the second conductive plate 162 of the additional parallel plate resonator 160 are capacitively and inductively coupled to each other and to the conductive plates 151, 152 of the parallel plate resonator 150. Accordingly, the parallel plate resonator 150 and the additional parallel plate resonator 160 form a structure of multiple cascaded parallel plate resonators 150, 160 at the exit end of the waveguide 120. The cascaded parallel plate resonators 150, 160 further enhances the bandwidth of the antenna 100.

Figure 8:
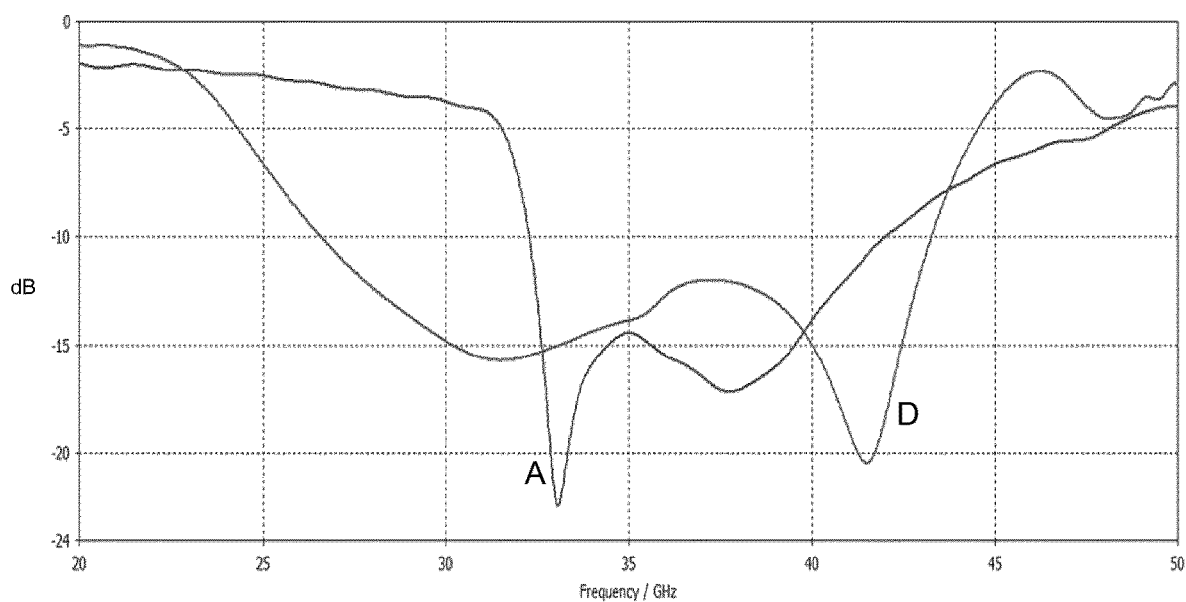
FIG. 8 shows a diagram for illustrating a frequency characteristic of the antenna variant of FIG. 7.

FIG. 8 shows exemplary frequency characteristics for illustrating the effect of the cascaded parallel plate resonators 150, 160. In FIG. 8, a frequency characteristic of the antenna 100 including the cascaded parallel plate resonators 150, 160 is denoted by D. For comparison, FIG. 8 also shows the frequency characteristic of the antenna 100 when including only the parallel plate resonator 150, but not the additional parallel plate resonator 160, like in FIG. 3 denoted by A. As can be seen, a resonant frequency range of the antenna 100 including the cascaded parallel plate resonators 150, 160 is significantly wider than in the case with only the parallel plate resonator 150.

When measuring the bandwidth at −10 dB, the antenna 100 with the cascaded parallel plate resonators 150, 160 provides a bandwidth of about 16 GHz, covering many frequency bands intended to be used for 5G cellular radio technologies.

It is noted that while in the example of FIG. 7 monopole structures were provided only in the parallel plate resonator 150, it is also possible to provide each of multiple cascaded parallel plate resonators at an exit end of the waveguide 120 with one or more monopole structures. Such further monopole structures allow for still further enhancing the bandwidth of the antenna and/or for tuning the bandwidth into a desired frequency range. An example of a corresponding variant of the antenna 100 is illustrated in FIG. 9.

Figure 9:
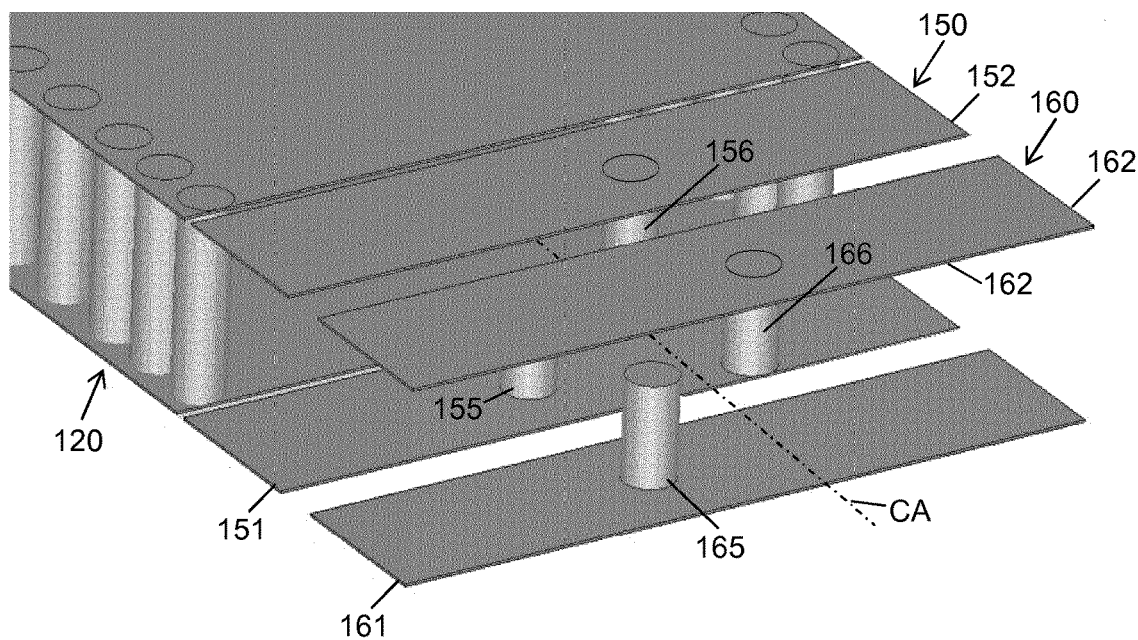
FIG. 9 shows a perspective view schematically illustrating a variant of the antenna with cascaded parallel plate resonators which each include multiple monopole structures.

In the example of FIG. 9, the cascaded parallel plate resonators 150, 160 have a similar configuration as in the example of FIG. 7. However, in this case also the additional parallel plate resonator 160 is provided with monopole structures, formed by a first conductive via 165 extending from the first conductive plate 161 of the additional parallel plate resonator 160 towards the second conductive plate 162 of the additional parallel plate resonator 160, and a second conductive via 166 extending from the second conductive plate 162 of the additional parallel plate resonator 160 towards the first conductive plate 161 of the additional parallel plate resonator 160. Similar to the first conductive via 155 and the second conductive via 156, the first conductive via 165 and the second conductive via 166 of the additional parallel plate resonator 160 are formed according to an arrangement which is rotationally symmetric with respect to the central axis CA of the waveguide 120. Specifically, when rotating the first conductive via 165 and the second conductive via 166 by 180° about the central axis CA of the waveguide 120, the first conductive via 165 will take the former position of the second conductive via 166, and the second conductive via 166 will take the former position of the first conductive via 165. This symmetric arrangement of the first conductive via 165 and the second conductive via 166 allows for avoiding an asymmetry of the radiation pattern of the antenna 100.

While in the above examples there was only one monopole structure on each conductive plate 151, 152, 161, 162 of the parallel plate resonators 150, 160, it is also possible that the magnetoelectric matching transition includes multiple monopole structures arranged on the same conductive plate of a parallel plate resonator. That is to say, in a variant of the antenna 100 the parallel plate resonator 150 could include multiple monopole structures formed by conductive vias extending from the first conductive plate 151 towards the second conductive plate 152 and/or multiple monopole structures formed by conductive vias extending from the second conductive plate 152 towards the first conductive plate 151. Similarly, the additional parallel plate resonator 160 could include multiple monopole structures formed by conductive vias extending from the first conductive plate 161 towards the second conductive plate 162 and/or multiple monopole structures formed by conductive vias extending from the second conductive plate 162 towards the first conductive plate 161. An example of a corresponding variant of the antenna 100 is illustrated in FIG. 10.

Figure 10:
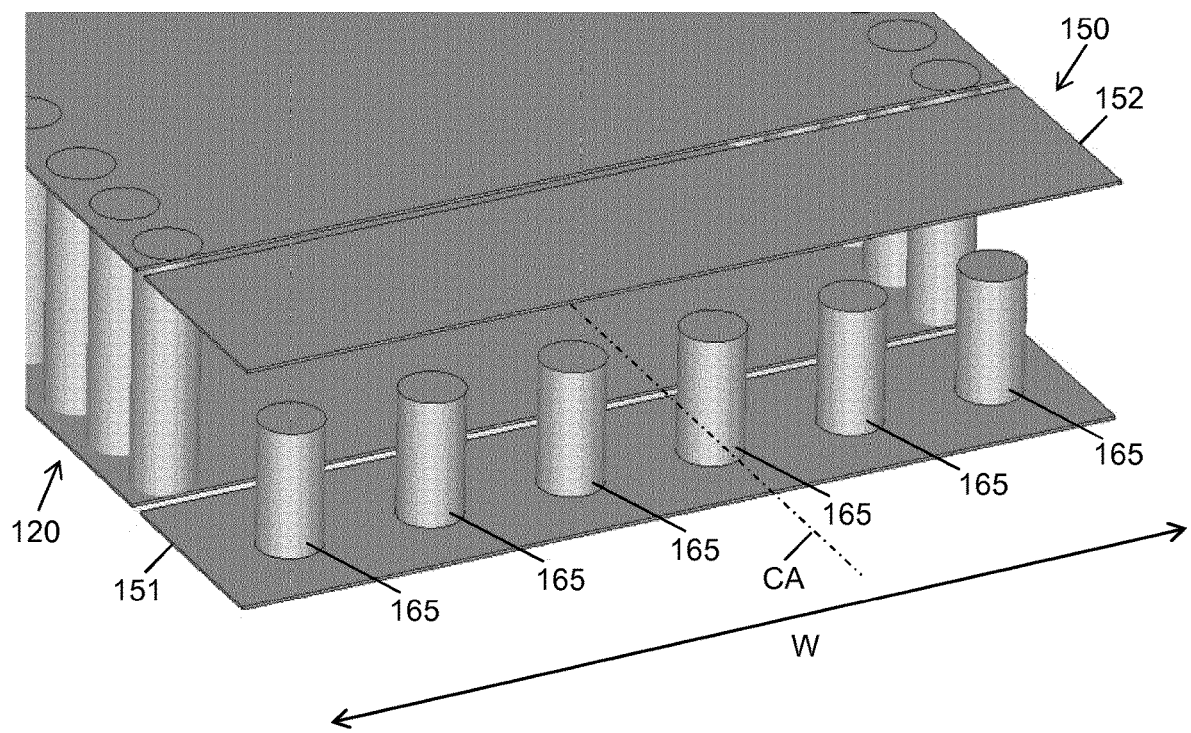
FIG. 10 shows a perspective view schematically illustrating a variant of the antenna with multiple monopole structures extending from one plate of a parallel plate resonator of the antenna.

In the example of FIG. 10 the parallel plate resonator 150 has a similar configuration as in the example illustrated by FIGS. 1A, 1B, and 2A. However, in this case the parallel plate resonator 150 is provided with multiple monopole structures formed by multiple conductive vias 155 extending from the first conductive plate 151 of the parallel plate resonator 160 towards the second conductive plate 152 of the parallel plate resonator 160. As illustrated, the multiple conductive vias 155 are regularly distributed along a width direction W of the parallel plate resonator 150. Further, an arrangement of the multiple conductive vias 155 is mirror-symmetric with respect to a vertical plane through the central axis CA of the waveguide 120. This symmetric arrangement of the first conductive via 165 and the second conductive via 166 allows for obtaining radiation pattern of the antenna 100 which is more homogeneous along the width direction W and in a horizontal plane is symmetric with respect to the central axis CA of the waveguide 120.

In the above examples, a method of manufacturing the antenna 100 may include providing a waveguide formed by a first horizontal conductive layer of a multi-layer circuit board, a second horizontal conductive layer of the multi-layer circuit board, and vertical sidewalls formed by conductive vias extending between the first conductive layer and the second conductive layer. Further, the method may include providing a parallel plate resonator at one end of the waveguide, the parallel plate resonator being formed in the multi-layer circuit board by a first horizontal conductive plate adjacent to the first conductive layer and a second horizontal conductive plate adjacent to the second conductive layer. Further, the method may include providing at least one conductive via extending from one of the first conductive plate and the second conductive plate towards the other of the first conductive plate and the second conductive plate. Accordingly, the antenna 100 may be efficiently formed by providing patterned conductive structures in the multi-layer circuit board.

Figure 11:
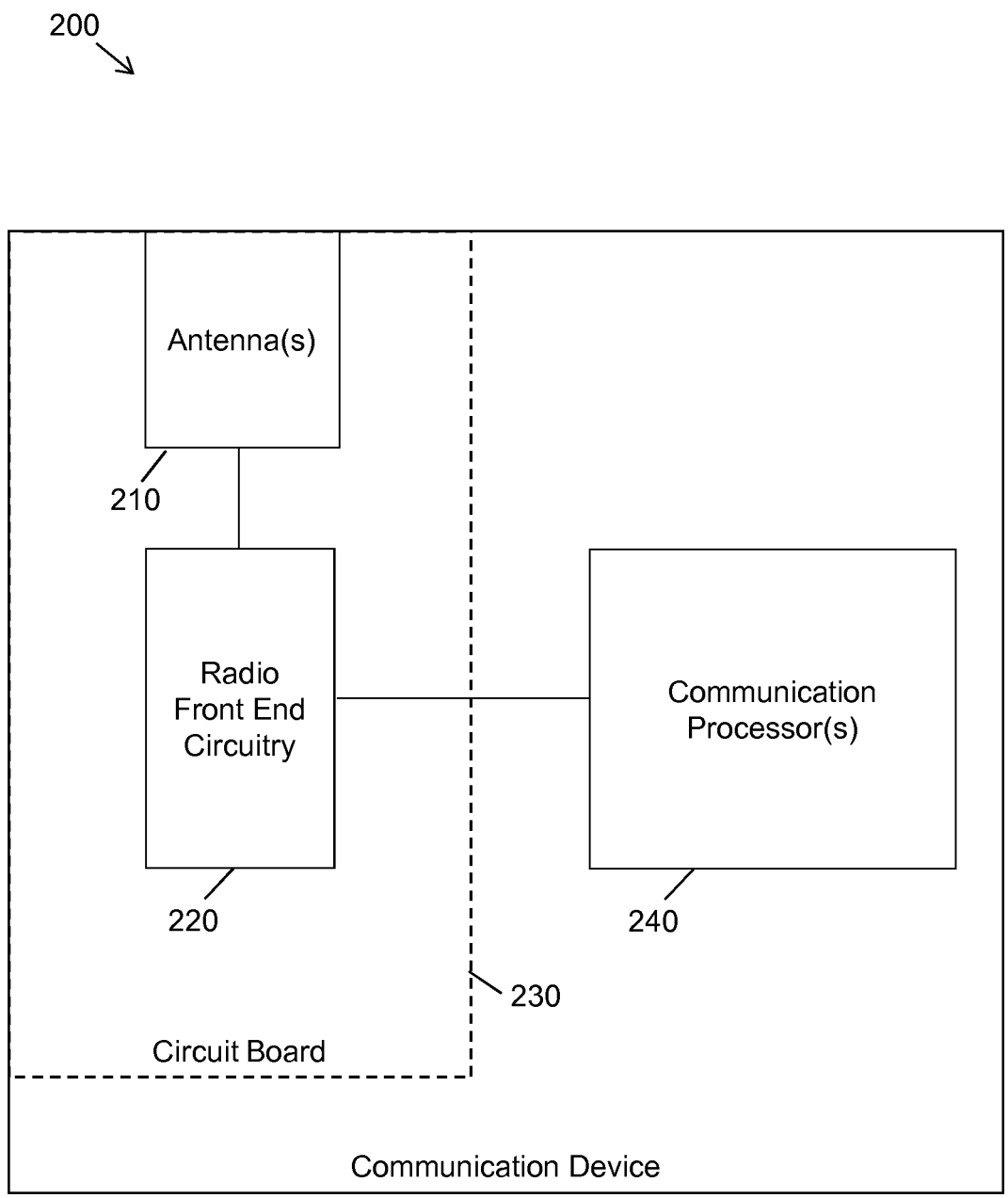
FIG. 11 shows a block diagram for schematically illustrating a communication device according to an embodiment of the invention.

FIG. 11 schematically illustrates a communication device 200 which is equipped with an antenna as explained above, e.g., with the antenna 100. The communication device 200 may correspond to a small sized user device, e.g., a mobile phone, a smartphone, a tablet computer, or the like. However, it is to be understood that other kinds of communication devices could be used as well, e.g., vehicle based communication devices, wireless modems, or autonomous sensors.

As illustrated, the communication device 200 includes one or more antennas 210. These antennas 210 include at least one antenna of the above-mentioned type having a waveguide and magnetoelectric matching transition including a parallel plate resonator with at least monopole structure on at least one conductive plate of the parallel plate resonator. For example, the antennas 210 may include one or more antennas corresponding to the above-mentioned antenna 100. Further, the communication device 200 may also include other kinds of antennas. The antennas 210 may be integrated together with radio front end circuitry 220 on a multi-layer circuit board 230, such as the above-mentioned multi-layer PCB 110. As further illustrated, the communication device 200 also includes one or more communication processor(s) 240. The communication processor(s) 240 may generate or otherwise process communication signals for transmission via the antennas 210. For this purpose, the communication processor(s) 240 may perform various kinds of signal processing and data processing according to one or more communication protocols, e.g., in accordance with a 5G cellular radio technology.

It is to be understood that the concepts as explained above are susceptible to various modifications. For example, the concepts could be applied in connection with various kinds of radio technologies and communication devices, without limitation to a 5G technology. Rather, the concepts are applicable in various frequency ranges and with various antenna bandwidths. The illustrated antennas may be used for transmitting radio signals from a communication device and/or for receiving radio signals in a communication device. The antennas may be produced in an efficient manner, e.g., by using various PCB technologies to provide the conductive layers, plates, and vias. Further, it is to be understood that the illustrated antenna structures may be subjected to various modifications concerning antenna geometry. For example, the illustrated substantially rectangular geometry of the waveguide could be modified to more complex shapes, e.g., to a horn shape. Moreover, the concepts are not limited to the illustrated examples of symmetric configurations of the monopole structures.

The invention claimed is:

1. An antenna, comprising:
a waveguide formed by a first horizontal conductive layer of a multi-layer circuit board, a second horizontal conductive layer of the multi-layer circuit board and vertical sidewalls formed by conductive vias extending between the first conductive layer and the second conductive layer,
a parallel plate resonator at one end of the waveguide, the parallel plate resonator being formed in the multi-layer circuit board by a first horizontal conductive plate adjacent to the first conductive layer and a second horizontal conductive plate adjacent to the second conductive layer;
a first conductive via having a first vertical height and extending from the first conductive plate towards the second conductive plate; and
a second conductive via having a second vertical height and extending from the second conductive plate towards the first conductive plate; wherein
the first vertical height and the second vertical height are less than a vertical distance between the first conductive plate and the second conductive plate, and the first conductive via and the second conductive via are formed according to an arrangement that is rotationally symmetric with respect to a central axis (CA) of the waveguide.

2. The antenna according to claim 1, comprising:
a plurality of first conductive vias extending from the first conductive plate towards the second conductive plate, and
a plurality of second conductive vias extending from the second conductive plate towards the first conductive plate.

3. The antenna according to claim 1, comprising:
a further parallel plate resonator, the further parallel plate resonator being formed in the multi-layer circuit board by a first further horizontal conductive plate adjacent to the first conductive plate of the parallel plate resonator and a second further horizontal conductive plate adjacent to the second conductive plate of the parallel plate resonator.

4. The antenna according to claim 3, comprising:
at least one conductive via extending from one of the first further conductive plate and the second further conductive plate of the further parallel plate resonator towards the other of the first further conductive plate and the second further conductive plate of the further parallel plate resonator.

5. The antenna according to claim 4, comprising:
multiple conductive vias extending from one of the first further conductive plate and the second further conductive plate of the further parallel plate resonator towards the other of the first further conductive plate and the second further conductive plate of the further parallel plate resonator.

6. The antenna according to claim 5,
wherein an arrangement of the conductive vias extending from the first further conductive plate and/or the second further conductive plate is symmetric with respect to a central axis (CA) of the waveguide.

7. The antenna according to claim 4, comprising:
at least one first conductive via extending from the first further conductive plate towards the second further conductive plate of the further parallel plate resonator, and
at least one second conductive via extending from the second further conductive plate towards the first further conductive plate of the further parallel plate resonator.

8. The antenna according to claim 4,
wherein a vertical height of the at least one conductive via extending from the first further conductive plate and/or the second further conductive plate of the further parallel plate resonator is less than a vertical distance between the first further conductive plate and the second further conductive plate.

9. The antenna according to claim 1,
wherein the antenna is configured for transmission of radio signals having a wavelength of more than 1 mm and less than 3 cm.

10. The antenna according to claim 1,
wherein a bandwidth of the antenna is at least 8 GHz.

11. The communication device according to claim 10, comprising:
radio front end circuitry arranged on the multi-layer circuit board.

12. A communication device, comprising:
at least one antenna according to claim 1; and
at least one processor configured to process communication signals transmitted via the at least one antenna.

\* \* \* \* \*